United States Patent [19]

Hartleroad et al.

[11] 3,868,764

[45] Mar. 4, 1975

[54] MULTIPLE MAGNETIC ALIGNMENT OF SEMICONDUCTOR DEVICES FOR BONDING

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 9, 1973

[21] Appl. No.: 414,273

[52] U.S. Cl. .................... 29/589, 29/471.1, 29/628, 29/203 P, 228/6

[51] Int. Cl. .......................... B23k 5/00, H01l 7/00

[58] Field of Search ........... 29/203 P, 203 J, 203 V, 29/203 MM, 589, 576 S, 626, 628, 471.1–3; 228/4–6; 214/1 R, 152, 1 B

[56] References Cited

UNITED STATES PATENTS

| | | | |
|---|---|---|---|
| 3,128,544 | 4/1964 | Allingham | 29/471.1 X |
| 3,174,837 | 3/1965 | Mears | 29/203 MM UX |
| 3,341,030 | 9/1967 | Engels | 214/152 X |
| 3,448,777 | 6/1969 | Scheffer | 29/203 MM X |
| 3,612,955 | 10/1971 | Butherus et al. | 29/471.1 X |
| 3,722,072 | 3/1973 | Beyerlein | 29/471.3 |
| 3,731,377 | 5/1973 | Muckelroy | 29/626 |
| 3,776,394 | 12/1973 | Miller | 214/1 R |

*Primary Examiner*—Al Lawrence Smith
*Assistant Examiner*—K. J. Ramsey
*Attorney, Agent, or Firm*—Robert J. Wallace

[57] ABSTRACT

A method and apparatus for simultaneously magnetically aligning a plurality of integrally leaded semiconductor device chips with conductive lead frame structures for bonding thereto. The semiconductor device chips having a plurality of soft ferromagnetic integral leads on one face thereof are placed in recesses within one surface of a template which serves as a temporary carrier. The template has soft ferromagnetic cores which extend from each of the recesses to an opposite surface of the template. A conductive lead frame structure is positioned so that sets of soft ferromagnetic finger portions overlie each chip within the template recess. A magnetic force is transmitted through selected cores to raise the chips from the template recess and simultaneously rotate them horizontally into precise aligned engagement with their corresponding fingers so that they can be bonded thereto. In a preferred embodiment, the template includes venting means extending from the recesses to facilitate hot gas flow for bonding the chip to the lead frame finger set.

4 Claims, 7 Drawing Figures

MULTIPLE MAGNETIC ALIGNMENT OF SEMICONDUCTOR DEVICES FOR BONDING

BACKGROUND OF THE INVENTION

This invention relates to a method and apparatus for transferring integrally leaded semiconductor device chips to conductive lead frame structures for bonding thereto. More particularly, it involves the use of a magnetic force to raise a plurality of chips from a distinctive positioning template into engagement with an overlying lead frame and to concurrently automatically orient the chip while in transit, so that integral leads on the chips are precisely aligned with corresponding fingers of the lead frame.

The present application is an improvement on U.S. patent application Ser. No. 414,274, entitled "Magnetic Alignment for Semiconductor Device Bonding", Hartleroad et al., filed concurrently with this application and assigned to the same assignee. The latter application (Ser. No. 414,274) discloses that a magnetic force can be utilized to automatically align integrally leaded semiconductor device chips with conductive lead frame structures so that they can be bonded thereto. In the aforesaid application, a semiconductor device chip having a plurality of soft ferromagnetic leads thereon is placed on an upper end of a soft ferromagnetic probe and raised to within close proximity of an overlying set of lead frame fingers. A magnetic force is transmitted through the probe to raise the chip the rest of the way to the lead frame fingers and concurrently automatically orient the chip so that the integral leads are precisely aligned with their corresponding lead frame fingers.

The present application provides a method and apparatus which are easily adaptable for production purposes which alleviates the time-consuming placement of individual chips on the alignment probe as previously described. Furthermore, this invention facilitates magnetically aligning a plurality of chips simultaneously for bonding to lead frame structures thereby providing additional time savings and reduction in labor cost.

OBJECTS AND SUMMARY OF THE INVENTION

Therefore, it is an object of this invention to provide a method and apparatus for magnetically aligning semiconductor device chips with conductive lead frame structures for bonding thereto, in which the method and apparatus are easily adaptable for production purposes.

It is a further object of this invention to provide a method and apparatus for simultaneously magnetically aligning a plurality of semiconductive device chips with conductive lead frame structures for bonding thereto without requiring a probe to carry the chips to within close proximity of the lead frame.

It is a more specific object of this invention to provide a practical production apparatus and method for magnetically raising a semiconductor device chip from a temporary carrier to a conductive lead frame structure, concurrently automatically orienting the chip with corresponding fingers of the lead frame while the chip is being raised, and for bonding the chip in place while it is in precisely aligned engagement with the lead frame fingers.

These and other objects of the invention are accomplished by placing a plurality of integrally leaded semiconductor device chips into recesses within one surface of a positioning template. The template has soft ferromagnetic cores which extend from the recesses to an opposite surface of the template. A conductive lead frame structure is positioned so that sets of soft ferromagnetic fingers overlie each chip within the recesses. The template is preferably vibrated to prevent adhesion of the chip to the recesses in the template by static charges, frictional forces, or the like, and to insure general alignment of each chip with their corresponding lead frame fingers. A magnetic force is applied from the back side of the template to selected cores which transmit the magnetic force therethrough and raise the chip to the overlying finger sets. While the chips are being raised, each chip is concurrently automatically oriented by the magnetic force so that all of the chip leads are very precisely aligned with their corresponding lead frame fingers. The chips can then be permanently bonded to the lead frame fingers as by fusion of a bonding medium with a hot gas. In a preferred embodiment, the template has venting means extending from each recess to facilitate the hot gas bonding.

DESCRIPTION OF THE PREFERRED EMBODIMENT

Figure 1:
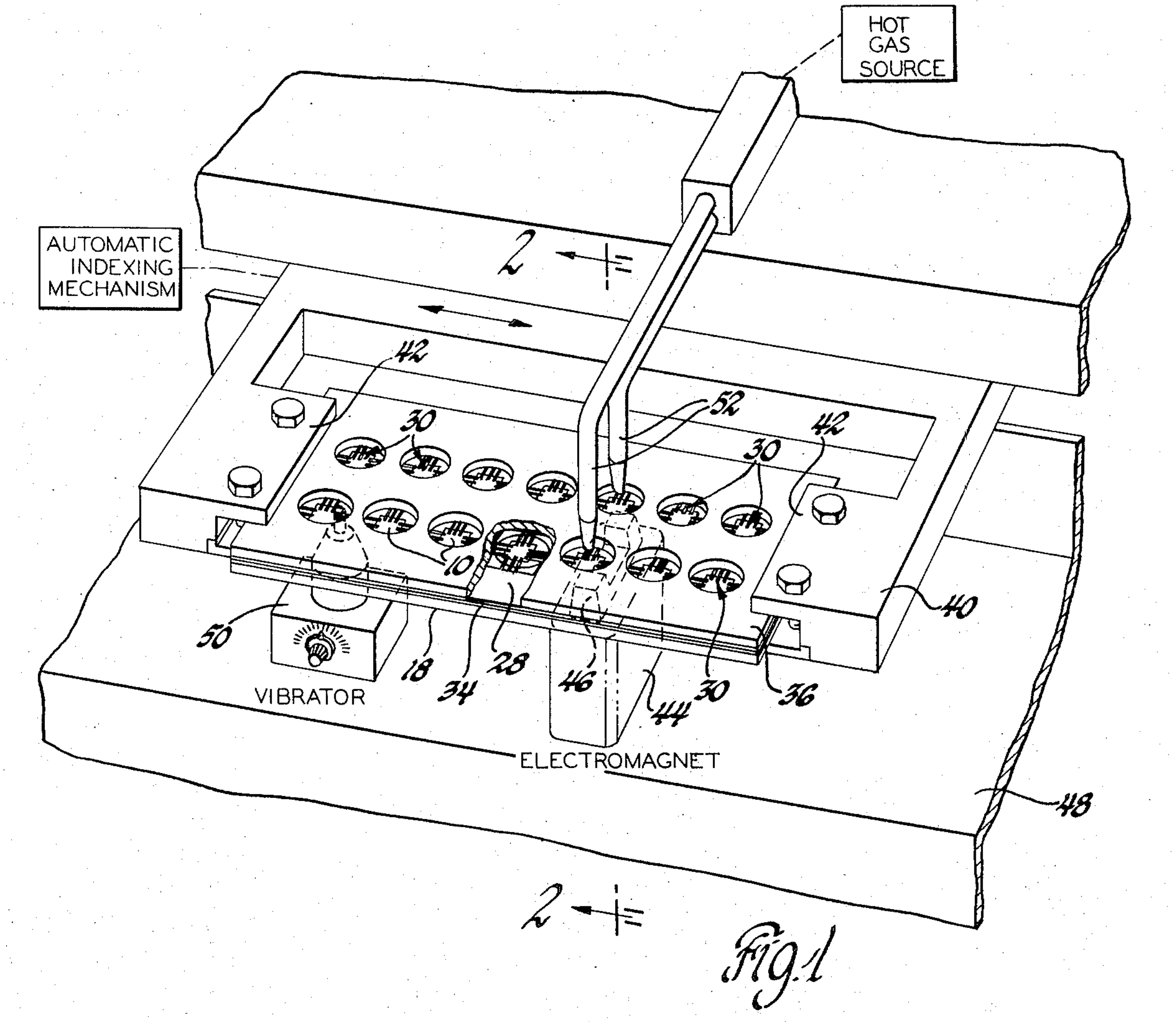
FIG. 1 shows a fragmented isometric view of the apparatus made in accordance with this invention.
Figure 2:
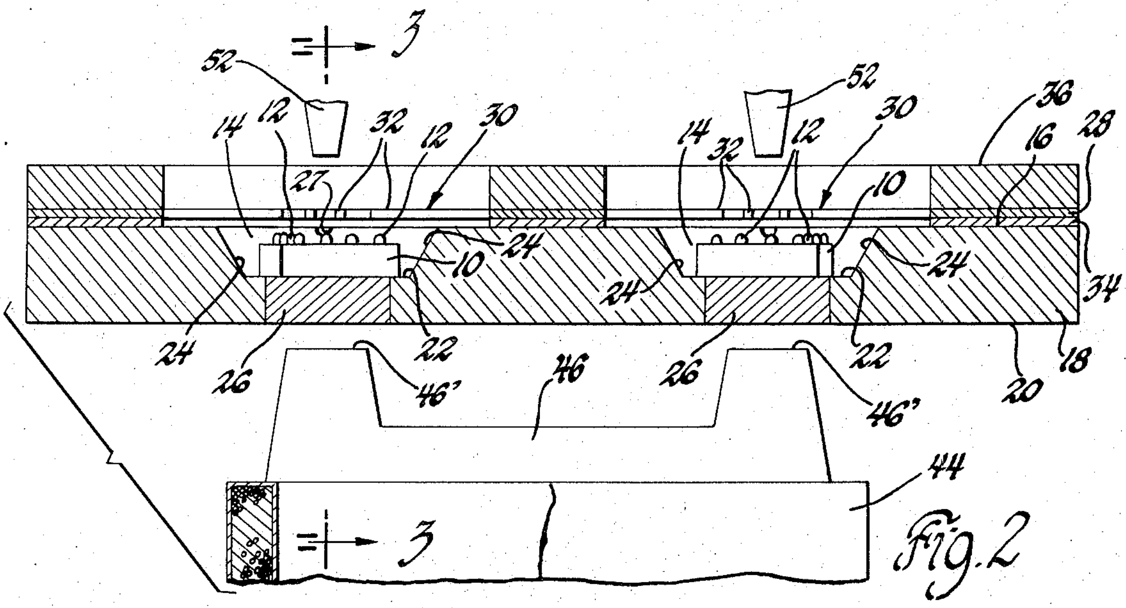
FIG. 2 shows an enlarged sectional view in partial elevation along the lines 2—2 of FIG. 1.

Referring now to the drawings, semiconductor flip chips 10 have a plurality of spaced contact bumps on one face of each chip. The flip chips 10 are silicon semiconductor integrated circuit device dies approximately 38 mils square and 11 to 13 mils thick between the two major faces. In this example, there are a dozen spaced contact bumps 12 on the upper major face of each chip and are equally spaced around the face periphery. Each individual contact bump is approximately 0.8 mil high and 3.8 mils square. For ease of illustration, the contact bumps 12 are shown enlarged with respect to the chips 10. The contact bumps are a composite of successive layers of aluminum, chromium, nickel, tin and gold, with the outermost layer being gold to permit making a eutectic bond with a gold plated lead frame. While the foregoing bump construction is preferred, it can be varied. However, the nickel content should be about 30%, and preferably about 60% by volume of the total contact bump volume, as is the case in this example.

It appears that the nickel content provides a low reluctance path by which magnetic flux lines can readily pass through the contact bumps. The greater than 30% by volume nickel in effect gives the contact bumps characteristics of a soft ferromagnetic material. By soft ferromagnetic material, we mean a material having a high overall magnetic permeability and a low residual magnetization, with a low coercive field required.

As can be seen in FIGS. 2 through 6, the flip chips 10 are situated in recesses 14 within a major surface of a template 18. The template 18 serves as a temporary carrier for the flip chip and aids in positioning the chips for bonding to a lead frame as will be hereinafter described. The template 18 has two major parallel surfaces 16 and 20. Template 18 is basically a rigid non-ferromagnetic stainless steel member approximately 10¼ inches long, 1¾ inches wide, and approximately one-eighth inch thick. The recesses 14 are located in spaced parallel columns within the template surface 16. The recesses 14 have a bottom portion 22 which is substantially parallel to the template surface 16 and has a surface area greater than the surface area of the back side face of flip chip 10. In this example, the bottom portion 22 is a square approximately 0.045 inch on a side. It has been found that for ease of placement of the chips therein and for general orientation of the chip, the surface area of the bottom portion should be approximately 30% larger than the surface area of the major face of the chip 10. Each recess has a depth from face 16 to bottom portion 22 which is approximately equivalent to the thickness of chip 10 plus the height of the contact bumps 12 thereon. Recess walls 24 diverge from the periphery of the bottom portion 22 at an angle of about 70° to facilitate chip placement and extend to the template face 16.

Cylindrical cores 26 extend from the bottom portion 22 to surface 20 of template 18. Cores are constructed of a soft ferromagnetic material such as soft iron. The cores are preferably about the same diameter as the chip maximum width, and several times thicker than the chip. Hence, they are approximately 0.038 inch in diameter and are about 0.110 inch thick. As will be more fully understood in the method description of this invention, the purpose of cores 26 is to transmit magnetic lines of flux to the flip chip within the recess 24. Hence, they can be of other soft ferromagnetic materials such as soft ferrites, pure nickel, and the like.

Figure 3:
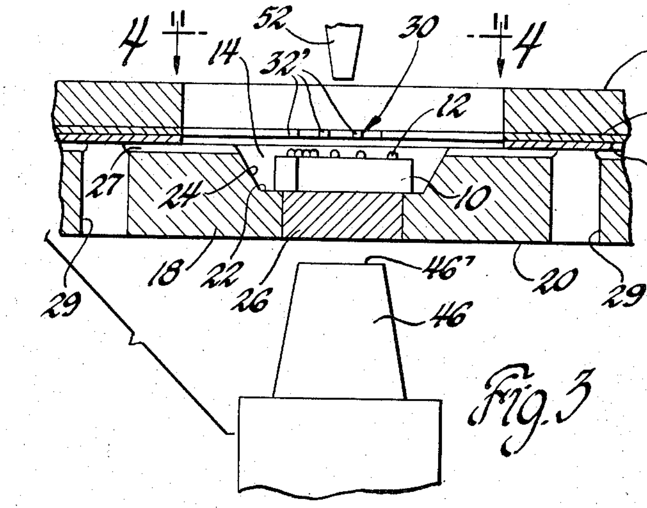
FIG. 3 shows a sectional view in partial elevation along the lines 3—3 of FIG. 2.
Figure 4:
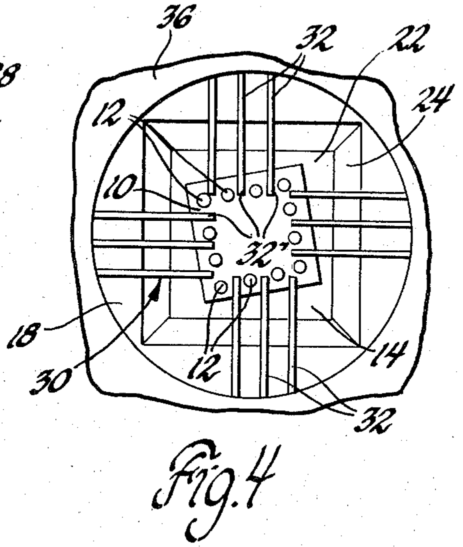
FIG. 4 shows a top plan view along the lines 4—4 of FIG. 3.
Figures 5, 6, 7:
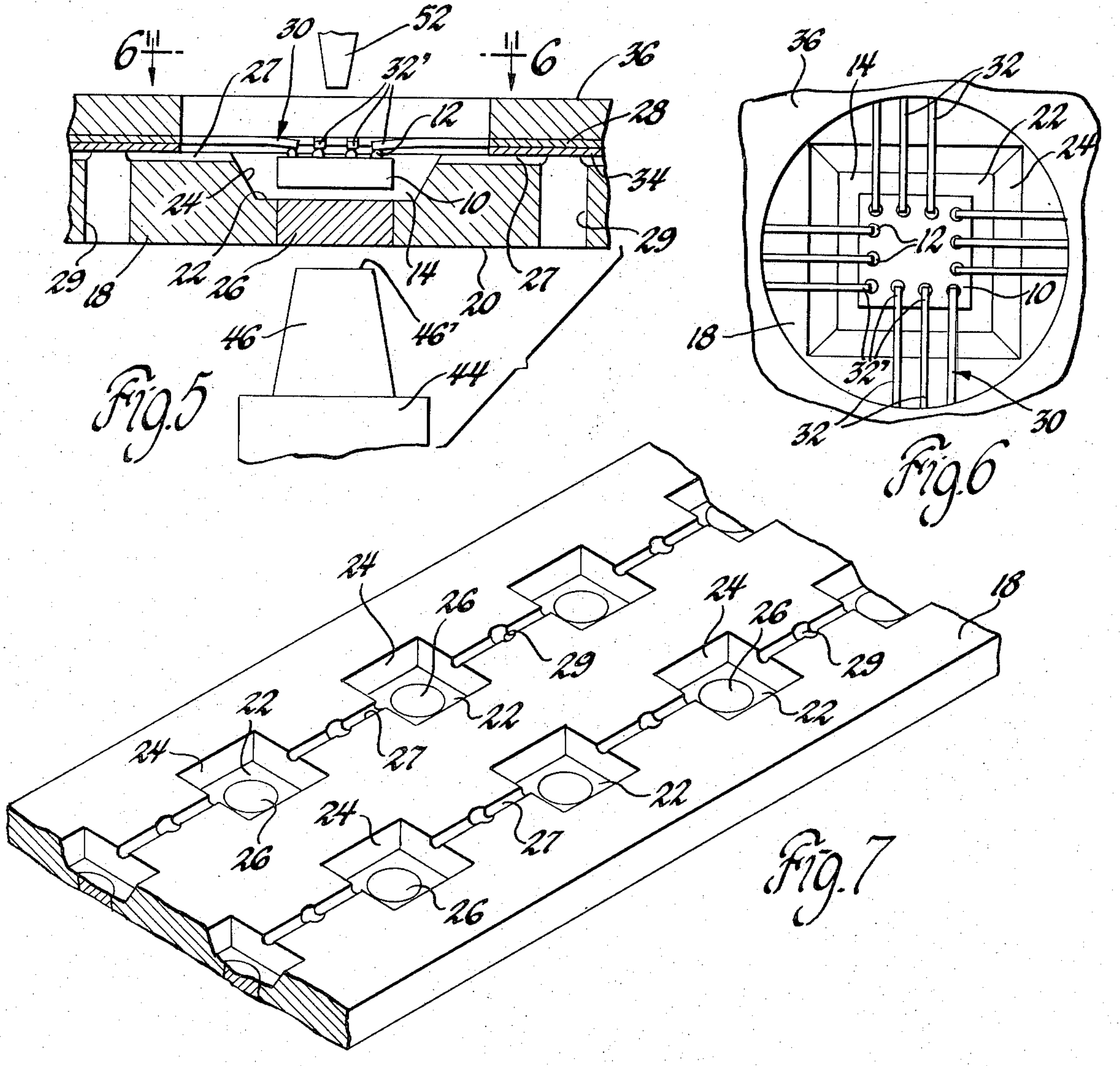
FIG. 5 shows a sectional view in partial elevation analogous to FIG. 3 but after chip transfer.
FIG. 6 shows a top plan view along the lines 6—6 of FIG. 5.
FIG. 7 shows an enlarged fragmented isometric view of the template shown in FIGS. 1 - 6.

As can thus be seen in FIGS. 3, 5 and 7, grooves 27 extend longitudinally between the columns of recesses 24. Grooves 27 are located in surface 16 of the template and are about 0.02 inch deep therein. There are a plurality of holes 29 between adjacent recesses which extend from grooves 27 through the thickness of the template 18 to surface 20 thereof. These holes 29 are approximately one-sixteenth inch to one-fourth inch in diameter. The grooves 27 and holes 29 coact to provide venting means to facilitate hot gas flow during the bonding operation as will hereinafter be described.

Lead frame 28 is constructed of a soft ferromagnetic material such as alloy 42, which has been coated with a thin layer of gold. Alloy 42 is an alloy containing, by weight, 41.5% nickel, 0.05% carbon, 0.5% manganese, 0.25% silicon, and the balance iron. The lead frame 28 is approximately 10¼ inches long, 1¾ inches wide, and 25 mils thick. The lead frame 28 has a plurality of sets 30 of mutually spaced inwardly diverging cantilevered fingers 32, with the sets being spaced from each other and arranged in parallel columns to correspond with the recesses 24. The fingers in each set have free inner ends 32' arranged in a predetermined pattern which corresponds to the contact bump 12 pattern on semiconductor flip chips 10. The gold plated alloy 42 lead frame has provided extemely satisfactory results. However, it is appreciated that the gold plating might be omitted if one did not want to attach the bumps by eutectic bonding. If another form of bump-finger attachment is used, another coating, more coatings, or no coating may be preferred. For example, the fingers, the bumps, or both, may be solder coated. It appears that it is most important that the lead frame fingers be of the soft ferromagnetic material. If so, then only these portions need be of alloy 42, or the like, and the balance of the lead frame can be of another material. Analogously, the lead frame could be of a laminate of a soft ferromagnetic material and any other material, including plastic.

The lead frame 28 is mounted over the template surface 16 so that one set 30 of lead frame fingers 32 overlie each semiconductor chip 10 and the pocket recesses within the template. The lead frame 28 is spaced from the template in this example by a non-ferromagnetic stainless steel spacer member 34. The spacer member 34 is generally coextensive with the lead frame 28 and has circular openings therein which correspond to and are slightly larger than the recesses 24. The spacer member is of a predetermined thickness and spaces the underside of lead frame fingers at the desired height above the flip chip contact bumps 12, this distance being between about 2 to 8 mils. In this example the spacer member 34 is 0.004 inch thick. It should be noted that the depth of the recesses in the template and the thickness of the spacer member in combination determine the spacing between the overlying sets of lead frame fingers and chip contact bumps. Hence, for a desired spacing, shallower template recesses dictate thicker spacer members, and vice versa. Moreover, the spacer can be eliminated entirely if the depth of recesses is sufficient.

A metallic cover plate 36 is juxtaposed on the opposite side of spacer 34 to sandwich the lead frame 28 therebetween. The cover plate 36 and spacer 34 hold the sets 30 of fingers substantially coplanar. The cover plate 36 is generally coextensive to the lead frame and is constructed of SAE 300 series stainless steel which is not significantly ferromagnetic and is approximately one-sixteenth inch thick. The cover plate 36, the lead frame 28, the spacer 34, and template 18 with the semiconductor flip chips therein are held together in mutual registration by means of clamp 42 on the ends of arms 40 as can be seen in FIG. 1. The arms 40 are connected to a supporting automatic indexing mechanism designated by the box in FIG. 1. The lead frame is supported parallel to the base member 48. The automatic indexing mechanism moves the lead frame-template assembly in the direction of the arrows of FIG. 1 to successively position the cores of adjacent template recesses over a bifurcated end portion 46 of an electromagnet 44.

The electromagnet 44 is constructed of approximately 630 turns of 36 guage enameled copper wire and is about 1⅛ inch in length. The bifurcated end portion is an extension of a soft ferromagnetic core which extends to base member 48 and is surrounded by the winding. The end portions 46 correspond with the cores of adjacent recesses of template 18 as can be seen most clearly in FIG. 2. The tip 46' of electromagnetic end portion 46 has a cross-sectional area slightly smaller than that of cores 26 and, as will later be understood, the purpose of the end portion 46 is to concentrate magnetic lines of flux from the electromagnet and transmit them perpendicularly to the cores 26. As is well known in the art, the electromagnet can be energized by a typical DC power supply which supplies an average of about 15 volts and 0.5 amperes.

A vibratory source 50 has an extension which abuts the face 20 of the template 18. The vibratory source 50 can be a variable pulse generator which provides vibratory pulse at a rate of about 1,000 cycles per second. The vibratory source can also be applied by a typical hand engraver touching the arm 40, which in turn transmits the vibratory source to the template-lead frame assembly.

According to the method of our invention, flip chips 10 are placed one each in the plurality of recesses 14 of template 18 so that the contact bumps 12 are oriented upwardly. The lead frame 28 is then mounted above surface 16 of the template 18 with spacer 34 therebetween as hereinbefore described. The lead frame is positioned so that sets 30 of the lead frame fingers 32 overlie the semiconductor flip chips 10 in the recesses 14. By referring to FIGS. 3 and 4, one can see a flip chip 10 within the recesses 14 of template 18. However, as can be seen especially in FIG. 4, the contact bumps 12 will probably be slightly misaligned with their corresponding fingers 32 of the lead frame.

Once the lead frame 28 has been securely positioned as hereinbefore mentioned by means of cover plate 36 and clamps 42, a vibratory source 50 is activated to vibrate the template 18. While this step is not essential to our invention, we have found that the most consistent precise production alignment of the chips with the finger set occurs when the contact bumps are within close proximity of their corresponding finger free ends. By close proximity we mean when the contact bumps are brought to within 3 mils horizontal spacing of their respective finger free end, and when the bump pattern is oriented to within 20° $\Theta$ of the finger free end pattern, where theta ($\Theta$) is measured with respect to an imaginary axis perpendicular to the lead frame and passing through the center of the finger set. By vibrating the template prior to chip transfer, the chips are centered within their respective recesses so that the contact bumps are within close proximity of their corresponding finger free ends. Furthermore, this vibration tends to reduce any tendency for the flip chips to stick to the bottom portion of the template recess, thereby facilitating easy flip chip transfer as will now be described.

While concurrently applying the magnetic force, the template 18 is positioned by the automatic indexing mechanism so that cores 26 of adjacent recesses successively overlie electromagnet end portions 46. When the soft ferromagnetic cores become subject to the magnetic force from the electromagnet 44, they transmit magnetic lines of flux generally perpendicularly to the flip chips and the overlying lead frame fingers. The magnetic force raises the chips in the adjacent recesses up from the bottom portion of the recesses to the underside of the fingers 32 of the lead frame, as can be seen in FIGS. 5 and 6. In moving from the recess bottom portion toward the fingers, the flip chips are also concurrently automatically oriented by magnetic flux lines concentrated in the lead frame fingers and the chip contact bumps so that when the contact bumps 12 engage their corresponding fingers 32, they are precisely aligned therewith. This orientation can occur before or after the chip raises off the recess bottom portions but will always occur before the contact bumps 12 engage their respective fingers. As can be seen especially in FIG. 5, the lead frame fingers bend downward slightly to engage the contact bumps 12 on substantially the same plane. Hence, if one of the fingers have been upwardly bent during prior handling, the magnetic force will pull it down into the plane of the remaining fingers so that they all produce uniform aligned engagment with the contact bumps. Just how far the lead frame fingers bend downwardly or how far the chip raises from the bottom portion depends on various factors such as the strength of the magnetic field from the electromagnet, the concentration of flux lines in the area of the chip and overlying fingers, the size and weight of the chip, the size of the lead frame finger, etc.

The canted recess walls 24 allow the chip to have freedom of rotational movement when the chips traverse up to the fingers 32. Once the engagement is made between the contact bumps 12 and fingers 32, they are permanently bonded together by a hot gas blast from a bonding torch 52 while the magnetic force holds the chip against the lead frame. Typically, the hot gas is a nitrogen and hydrogen gas mixture at a temperature of approximately 500° C. which is supplied from a source, designated by the box in FIG. 1, connected to the torch. The hot gas melts the tin in the bump and gold outer surfaces of the contact bump 12 and finger dissolve in the tin to form a melt. The hot gas is then removed, and the melt resolidifies to form a permanent electrical and mechanical connection between the flip chip bumps 12 and the lead frame fingers 32. The grooves 27 and holes 29 provide exhaust ports to allow the hot gas to escape during the bonding step. These venting means facilitate the effectiveness of the hot gas bond by prohibiting a pressure dome from forming above the recesses 14 which may prevent the gas from heating the contact bump-finger engagement.

While the precise theoretical evaluation of this invention has not been completed, a general understanding can be ascertained. The electromagnet 44 produces a magnetic field with flux lines concentrating on the tips of the bifurcated end portion which is an extension of the core of the electromagnet. The flux lines are transmitted to and concentrated in the soft ferromagnetic cores 26 which are in register with the end portion tips of the electromagnet. Magnetic flux lines continue generally perpendicularly through the silicon of the semiconductor flip chip on the cores and are densely concentrated in the soft ferromagnetic contact bumps 12 on the chip. The magnetic flux lines transmitted through the contact bumps take the path of lowest reluctance which is through the soft ferromagnetic fingers of the lead frame. This concentration of flux lines and the contact bumps and the fingers causes the flip chip to traverse to the lead frame with the contact bumps automatically orienting themselves in precise register with their respective fingers of the lead frame.

It should be emphasized that this invention is not limited to only bonding two flip chips simultaneously, but may be used to align from one to many flip chips concurrently as should be evident to one skilled in the art. Furthermore, other integrally leaded semiconductor device chips such as beam leaded devices having soft ferromagnetic beam leads can be bonded to lead frame structures in accordance with the method and apparatus of this invention. Therefore, although this invention has been described in connection with a particular example thereof, no limitation is intended thereby except as defined in the appended claims.

What is claimed is:

1. A self-aligning method of automatically transferring integrally leaded semiconductor device chips to a conductive lead frame structure for permanently bonding thereto, said method comprising:

placing a semiconductor device chip having a face with a plurality of soft ferromagnetic integral leads thereon into a recess in one surface of a template so that said chip face is oriented upwardly, said recess having a bottom portion substantially parallel to said one template surface, said template having a core of soft ferromagnetic material extending from said recess bottom portion to an opposite surface of the template;

positioning a conductive lead frame structure having a soft ferromagnetic convergent cantilevered finger set over said template so that said fingers are spaced above in closely spaced relation with the chip in the template recess;

applying a magnetic force generally perpendicular to the underside of said core to precisely align said integral chip leads with corresponding fingers of said lead frame and to concurrently magnetically raise the chip from the template recess up to said fingers to produce a precisely aligned engagement between all of the integral chip leads and their corresponding fingers; and bonding said integral chip leads to said lead frame fingers while the magnetic force is still applied.

2. A self-aligning method of simultaneously automatically transferring a plurality of integrally leaded semiconducotr device chips to conductive lead frame structures for permanently bonding thereto, said method comprising:

placing a semiconductor device chip having a face with a pluality of soft ferromagnetic integral leads thereon into each of a plurality of recesses in one surface of a template so that said chip face of each of the chips therein are oriented upwardly, said recesses being spaced in parallel columns within said one template surface, said recesses having a bottom portion substantially parallel to said one template surface, said template having soft ferromagnetic cores extending from each of said recess bottom portions to an opposite surface of the template;

positioning a conductive lead frame structure having a plurality of sets of soft ferromagnetic convergent cantilevered fingers corresponding to said integral leads on said chip so that a set of fingers overlie in closely spaced relation with each chip in said template recesses;

vibrating said template to prevent the chips from adhering to said template recesses and to bring the integral chip leads within close proximity of their corresponding lead frame fingers;

applying a magnetic force generally perpendicular to the underside of said cores in adjacent recesses to precisely align said integral chip leads of the respective chips with corresponding lead frame fingers and to concurrently magnetically raise said chips from their respective template recesses up to the fingers to produce a precise aligned engagement between all of the integral chip leads of each of the chips and their corresponding lead frame fingers; and bonding said integral chip leads of the respective chips to their corresponding lead frame fingers while the magnetic force is still applied.

3. A distinctive semiconductor chip carrying template for positioning a plurality of integrally leaded semiconductor chips into spaced relation with an overlying conductive lead frame structure and for facilitating simultaneously aligning the chips through the utilization of a magnetic force, said template comprising a rigid substantially non-ferromagnetic metallic plate, said plate having two major parallel surfaces, a plurality of recesses in one surface thereof, said recesses located in spaced columns and rows therein, said recesses having a bottom portion substantially parallel to said one template surface and having a surface area slightly greater than the surface area of one face of said chip to be placed therein, a plurality of soft ferromagnetic cores, said cores extending from said recess bottom portion to the opposite major surface of said template thereby providing a low reluctance path for a magnetic field to be transmitted through said cores to said chips within said recesses.

4. A distinctive semiconductor device carrying template for positioning integrally leaded semiconductor chips into spaced relation with an overlying lead frame structure prior to bonding so that the chips can be magnetically transferred to and aligned therewith for bonding thereto and providing venting means to facilitate hot gas bonding, said template comprising a rigid, substantially non-ferromagnetic, metallic plate, said plate having two major parallel surfaces, a plurality of recesses in one surface, said recesses located in spaced columns and rows in said one surface, said recesses having a rectangular bottom portion substantially parallel to said one surface, said bottom portion having a surface area slightly greater than the surface area of one major face of said semiconductor chip to be placed therein, said recesses having diverging walls extending from said bottom portion to said one surface, venting means extending from said recesses to the opposite surface of said template providing exhaust ports for permitting hot gas for chip bonding to escape therethrough, and a plurality of soft ferromagnetic cores extending from said bottom portion of said recesses to said opposite surface of said template, said cores permitting a magnetic force applied from said opposite surface to be transmitted therethrough.

* * * * *